United States Patent
Kokura

(10) Patent No.: US 7,595,261 B2
(45) Date of Patent: Sep. 29, 2009

(54) METHOD AND SYSTEM FOR MANUFACTURING SEMICONDUCTOR DEVICE HAVING LESS VARIATION IN ELECTRICAL CHARACTERISTICS

(75) Inventor: Hikaru Kokura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/245,086

(22) Filed: Oct. 7, 2005

(65) Prior Publication Data
US 2007/0026541 A1    Feb. 1, 2007

(30) Foreign Application Priority Data
Jul. 6, 2005    (JP) .............................. 2005-197224

(51) Int. Cl.
*H01L 21/425* (2006.01)
(52) U.S. Cl. .................. 438/514; 438/192; 438/510; 438/530; 438/301; 257/E21.135
(58) Field of Classification Search ............... 356/364, 356/369; 438/192, 299, 300, 301, 302, 303, 438/305, 306, 510, 514, 530; 257/E21.135
See application file for complete search history.

(56) References Cited

U.S. PATENT DOCUMENTS

| | | | | |
|---|---|---|---|---|
| 6,063,698 A * | 5/2000 | Tseng et al. | .................. | 438/585 |
| 6,128,084 A * | 10/2000 | Nanbu et al. | ................. | 356/369 |
| 6,233,046 B1 * | 5/2001 | Alba et al. | ..................... | 356/38 |
| 6,495,406 B1 * | 12/2002 | Honeycutt | .................. | 438/197 |
| 6,799,888 B2 * | 10/2004 | Shibata et al. | .............. | 374/159 |
| 6,963,401 B2 * | 11/2005 | Opsal et al. | ................. | 356/369 |
| 7,078,711 B2 * | 7/2006 | Borden | .................. | 250/492.21 |
| 7,122,417 B2 * | 10/2006 | Chang | ........................ | 438/231 |
| 2008/0142839 A1 * | 6/2008 | Fukutome et al. | ........... | 257/190 |

FOREIGN PATENT DOCUMENTS

JP    2001-326347    11/2001

* cited by examiner

*Primary Examiner*—Matthew Smith
*Assistant Examiner*—John M Parker
(74) *Attorney, Agent, or Firm*—Westerman, Hattori, Daniels & Adrian, LLP.

(57) ABSTRACT

A method of manufacturing a semiconductor device, which has a gate electrode and a pair of diffusion layers formed in a semiconductor substrate on sides of the gate electrode, includes forming an insulating film and a gate electrode on a semiconductor substrate, obtaining a thickness of an affected layer formed in a surface of the semiconductor substrate, forming a pair of diffusion layers by injecting an impurity element into the semiconductor substrate in areas flanking the gate electrodes based on a predetermined injection parameter, performing activating heat treatment based on a predetermined heat treatment parameter, and a parameter deriving step provided between the obtaining step and the diffusion layer forming step, the parameter deriving step deriving the injection parameter or heat treatment parameter in response to the obtained thickness of the affected layer such that the diffusion layers are set to a predetermined sheet resistance.

11 Claims, 9 Drawing Sheets

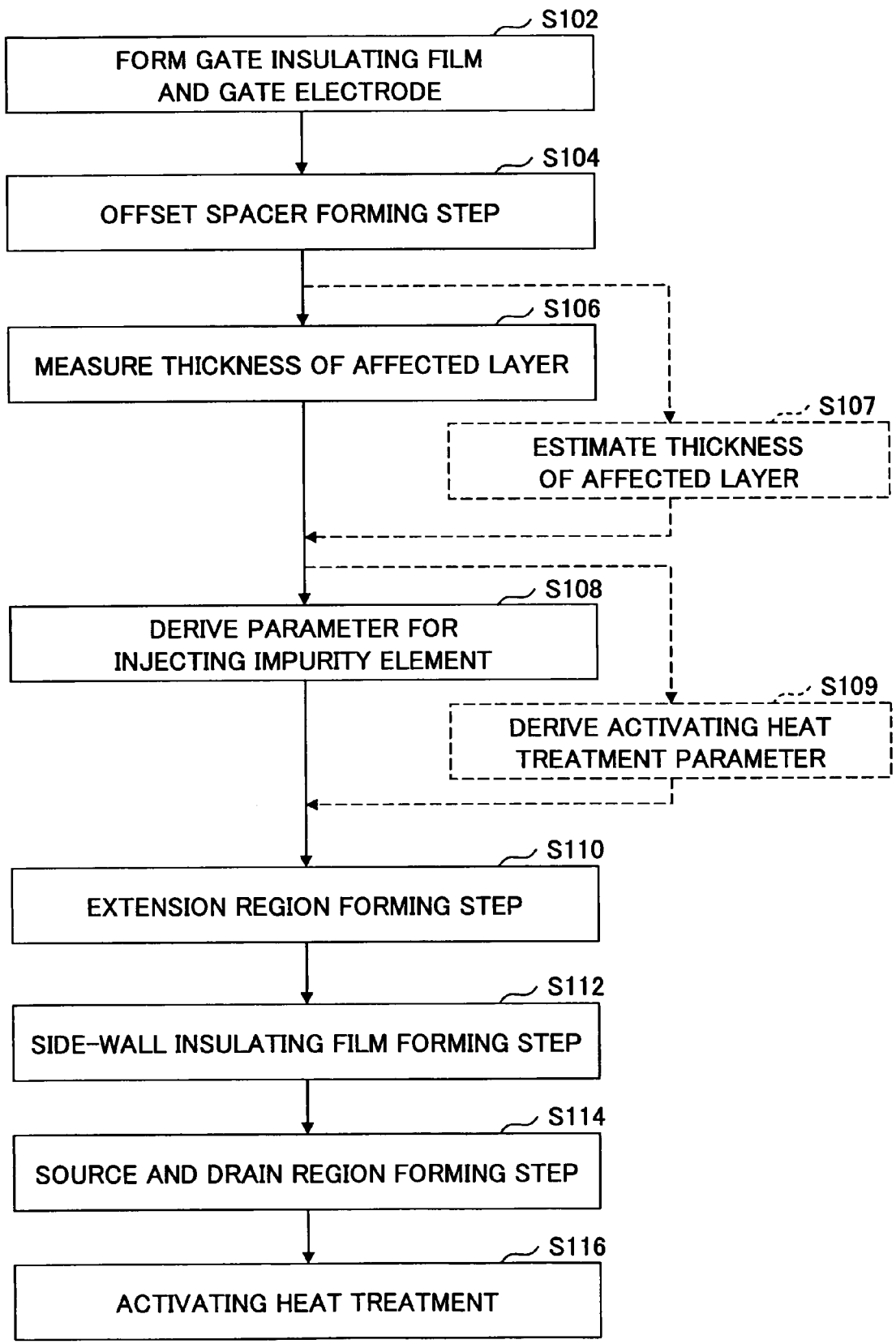

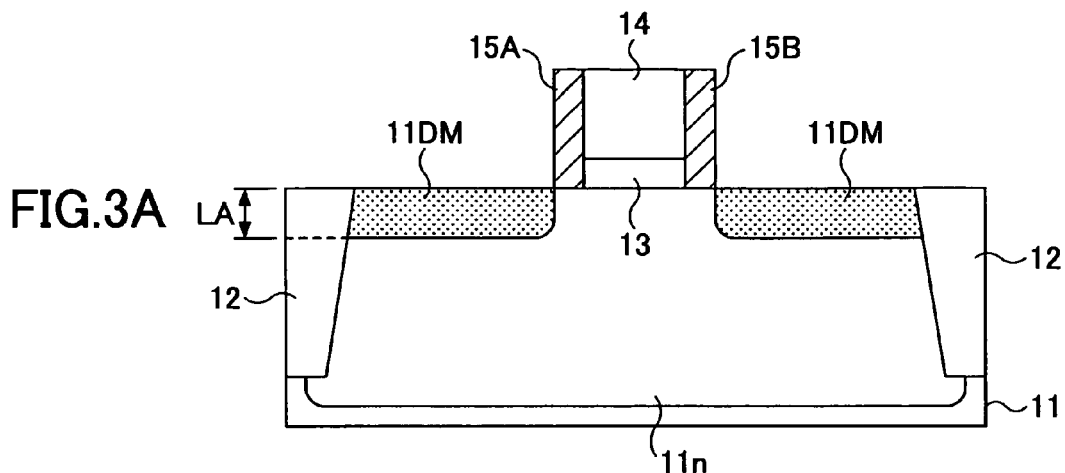
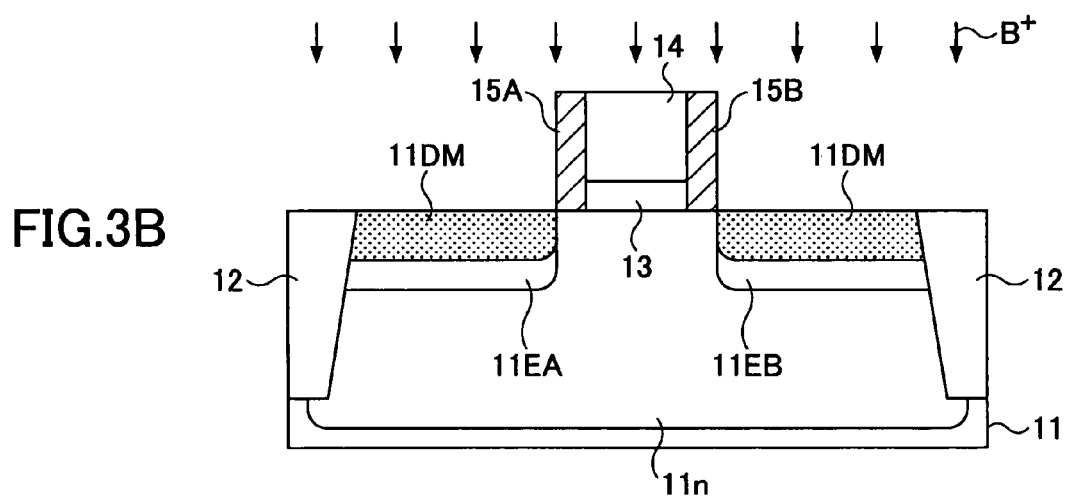
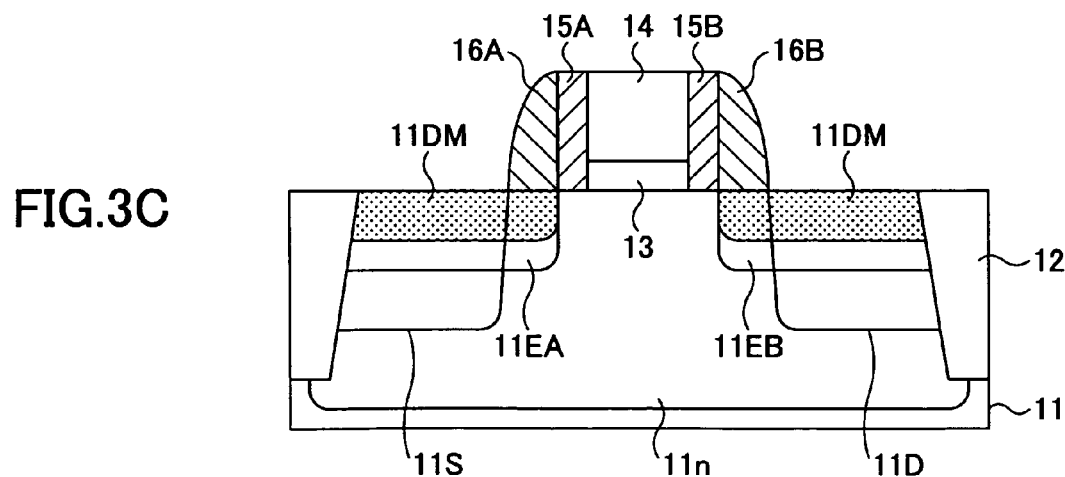

METHOD AND SYSTEM FOR MANUFACTURING SEMICONDUCTOR DEVICE HAVING LESS VARIATION IN ELECTRICAL CHARACTERISTICS

CROSS-REFERENCE TO RELATED APPLICATIONS

The present application is based upon and claims the benefit of priority from the prior Japanese Patent Application No. 2005-197224 filed on Jul. 6, 2005, with the Japanese Patent Office, the entire contents of which are incorporated herein by reference.

BACKGROUND OF THE INVENTION

1. Field of the Invention

The present invention generally relates to methods of manufacturing semiconductor devices and systems for manufacturing semiconductor devices, and particularly relates to a method of and system for manufacturing a MOS-type (metal-oxide-silicon type) field effect transistor capable of high speed operation.

2. Description of the Related Art

In a related-art process for manufacturing a MOS-type field effect transistor (MOSFET), an impurity element is injected as a dopant by use of an offset spacer as a mask to form an extension region in order to reduce offset capacitance between the gate and the source or between the gate and the drain. The offset spacer is made by forming an insulating film that covers the silicon substrate and the multilayer gate structure, followed by performing an etchback by use of the RIE (reactive ion etching) method or the like so as to leave only a portion of the insulating film flanking the side walls of the multilayer gate structure. The offset spacer serves to create the extension region such that the profile of the extension region on the gate side is spaced apart from the edge of the gate. This ensures that the extension region does not extend in the horizontal direction after an activating heat treatment to end up existing directly below the gate.

In recent years, size reduction in MOSFETs has been further pursued in order to improve the circuit density and operation speed of the MOSFETs. Together with the size reduction in MOSFETs, it is also required to further suppress a horizontal extension of the extension region. Especially when the extension region is formed deep, its horizontal extension tends to be large, which necessitates the control of the extension region so as to make it extremely shallow. Because of this, the energy for injecting impurity ion is now sometimes set below 1 KeV.

As the extension region is formed shallow in the silicon substrate, with a dry etching performed based on the RIE method at the time of forming an offset spacer, an energy for pulling ion into the silicon substrate is about the same as the energy for injecting impurity ion, resulting in the depth of an affected layer being substantially the same as the depth of the extension region. In this case, the crystalline quality of the surface of the silicon substrate may affect the electrical characteristics of the MOSFET.

[Patent Document] Japanese Patent Application Publication No. 2001-326347

There are large number of dry etching apparatuses used in the manufacturing of MOSFETs. These dry etching apparatuses have varying etching characteristics. In general, the high-frequency power of a dry etching apparatuses is set to the same predetermined value for a plurality of dry etching apparatuses when the same process is supposed to be performed. When the state of sediments in the apparatuses varies through continuous running and maintenance work, however, a mixture ratio of process gasses and/or ion density may change due to the mixing of the sediments. This causes the electric current running between electrodes to change, resulting in a change in the voltage that pulls etching ion into the substrate. When the voltage that pulls etching ion into the substrate increases, for example, the affected layer formed in the silicon substrate reaches a further depth. Due to such factors, the depth of the affected layer formed in the silicon substrate varies between the dry etching apparatuses. The affected layer is believed not to contribute to carrier conduction, so that the depth of the extension region largely contributing to the carrier conduction may end up having variation between silicon substrates. This gives rise to a problem in that the electrical characteristics of the MOSFETs such as on-resistance and threshold voltage may vary.

Accordingly, there is a need for a method of manufacturing semiconductor devices in which variation in electrical characteristics such as on-resistance between semiconductor substrates is suppressed. There is also a need for a system for manufacturing semiconductor devices in which variation in electrical characteristics such as on-resistance between semiconductor substrates is suppressed.

SUMMARY OF THE INVENTION

It is a general object of the present invention to provide a method and system for manufacturing a semiconductor device that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a method and system for manufacturing a semiconductor device particularly pointed out in the specification in such full, clear, concise, and exact terms as to enable a person having ordinary skill in the art to practice the invention.

To achieve these and other advantages in accordance with the purpose of the invention, the invention provides a method of manufacturing a semiconductor device, which has a gate electrode and a pair of diffusion layers formed in a semiconductor substrate on sides of the gate electrode. The method includes forming an insulating film and a gate electrode on a semiconductor substrate, obtaining a thickness of an affected layer formed in a surface of the semiconductor substrate, forming a pair of diffusion layers by injecting an impurity element into the semiconductor substrate in areas flanking the gate electrodes based on a predetermined injection parameter, performing activating heat treatment based on a predetermined heat treatment parameter, and a parameter deriving step provided between the obtaining step and the diffusion layer forming step, the parameter deriving step deriving the injection parameter or heat treatment parameter in response to the obtained thickness of the affected layer such that the diffusion layers are set to a predetermined sheet resistance.

According to at least one embodiment of the present invention, the thickness of the affected layer that affects carrier conduction in the diffusion layers is obtained, and the injection parameter or heat treatment parameter derived in response to the obtained thickness of the affected layer is used to perform the injection of an impurity element or an activating heat treatment. This allows the variation of the sheet resistance of the diffusion layers to be suppressed even when there is a variation in the thickness of the affected layer from silicon substrate to silicon substrate. As a result, it is possible to manufacture a semiconductor device in which the variation of electrical characteristics such as an on-resistance is reduced.

According to another aspect of the present invention, a system for manufacturing a semiconductor device, which has a gate electrode and a pair of diffusion layers formed in a semiconductor substrate on sides of the gate electrode, includes a manufacturing apparatus system including a dry etching apparatus, an ion injecting apparatus, and an activating heat treatment apparatus, a process control unit configured to obtain manufacturing history data from the manufacturing apparatus system, to derive a process recipe based on the obtained manufacturing history data, and to transmit the process recipe to the manufacturing apparatus system, and a communication unit connecting the manufacturing apparatus system to the process control unit, wherein the process control unit estimates a thickness of an affected layer in response to an etching condition of the dry etching apparatus by referring to a pre-acquired relationship between the etching condition of the dry etching apparatus and the thickness of the affected layer, and derives an injection parameter or heat treatment parameter in response to the estimated thickness of the affected layer such that the diffusion layers are set to a predetermined sheet resistance, and wherein the ion injecting apparatus and the activating heat treatment apparatus are controlled based on the injection parameter and the heat treatment parameter, respectively.

According to at least one embodiment of the present invention, the process control unit estimates the thickness of the affected layer in response to the etching condition obtained separately for each semiconductor substrate, and derives the injection parameter or heat treatment parameter in response to the estimated thickness of the affected layer. The ion injecting apparatus or activating heat treatment apparatus is then controlled based on the injection parameter or heat treatment parameter, respectively. This makes it possible to manufacture a semiconductor device in which the variation of the sheet resistance of the diffusion layers is suppressed between semiconductor substrates. With this provision, further, the variation of the sheet resistance of the diffusion layers is suppressed even when there is a variation in the thickness of the affected layer due to machine differences between a plurality of dry etching apparatuses. Accordingly, variation in the electrical characteristics of the semiconductor device is suppressed, thereby allowing semiconductor devices to be manufactured with a satisfactory yield. Further, since there is no need for an inspection apparatus for measuring the thickness of an affected layer, the manufacturing apparatus system can be simplified. Moreover, since the inspection apparatus is not provided, there is no need for maintenance of the inspection apparatus, which makes it possible to avoid a drop of the utilization rate of the semiconductor device manufacturing system due to the failure of the inspection apparatus.

According to at least one embodiment of the present invention, it is possible to provide a method of manufacturing a semiconductor device in which variation in the electrical characteristics is suppressed between semiconductor substrates, and also to provide a system for manufacturing a semiconductor device that suppresses the variation of the electrical characteristics.

BRIEF DESCRIPTION OF THE DRAWINGS

Other objects and further features of the present invention will be apparent from the following detailed description when read in conjunction with the accompanying drawings; in which:

FIG. 1 is a flowchart showing a method of manufacturing a semiconductor device according to a first embodiment of the present invention;

FIGS. 3A through 3C are drawings showing steps of manufacturing a semiconductor device according to the first embodiment of the present invention;

DESCRIPTION OF THE PREFERRED EMBODIMENTS

In the following, embodiments of the present invention will be described with reference to the accompanying drawings.

First Embodiment

FIG. 1 is a flowchart showing a method of manufacturing a semiconductor device according to a first embodiment of the present invention. FIG. 1 also shows manufacturing steps used in a method of manufacturing a semiconductor device according to a second embodiment, which will later be described.

Referring to FIG. 1, the method of manufacturing a semiconductor device according to the first embodiment includes a step (S102) of forming a gate insulating film and a gate electrode on the surface of a silicon substrate corresponding to a device area, an offset spacer forming step (S104), a step (S106) of measuring the thickness of an affected layer formed in the surface of the silicon substrate, a step (S108) of deriving a parameter for injecting an impurity element, an extension region forming step (S110) of injecting an impurity element into the silicon substrate, a side-wall insulating film forming step (s112), a step (S114) of forming a source region and drain region, and an activating heat treatment step (S116).

The manufacturing method of the present embodiment measures the thickness of an affected layer formed in the surface of the silicon substrate after the offset spacer forming step, and derives a parameter for injecting an impurity element based on the relationship between the injection parameter or heat treatment parameter acquired in advance, the sheet resistance, and the thickness of the affected layer such that a desired sheet resistance of the extension region is achieved. Based on the derived parameter, an extension region is formed by use of an ion injection method.

FIGS. 2A through 2C, FIGS. 3A through 3C, and FIG. 4 are drawings showing steps of manufacturing a semiconductor device according to the first embodiment of the present invention. A description will be given of an example in which a p-channel MOS transistor is formed.

Figure 2A:
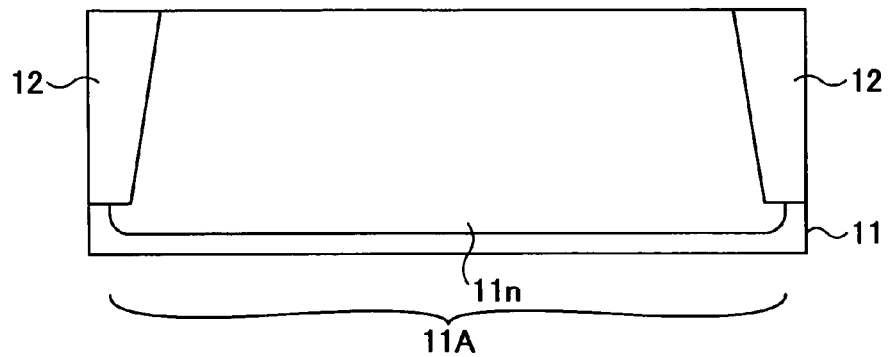
FIGS. 2A through 2C are drawings showing steps of manufacturing a semiconductor device according to the first embodiment of the present invention.

In the process step shown in FIG. 2A, a device region 11A is defined on the surface of a p-type silicon substrate 11 by a STI-type device separating structure 12. In the device region 11A, an n-type impurity element is injected through ion injection, thereby forming an n-type well 11$n$.

Figure 2B:
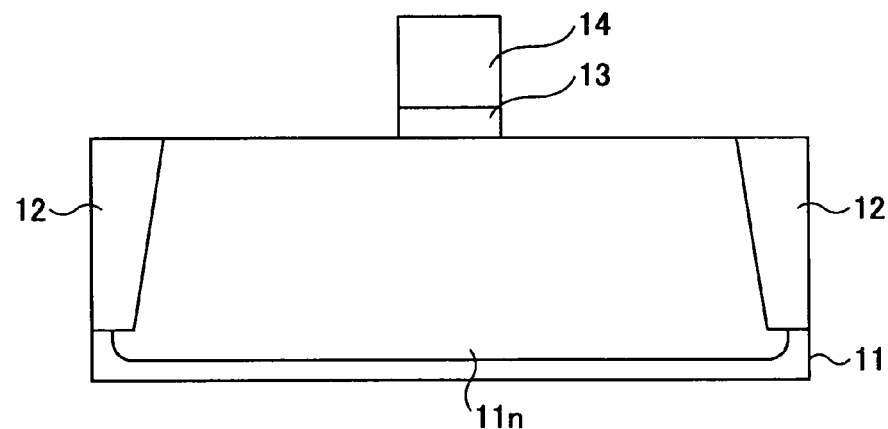

In the process step shown in FIG. 2B, a gate insulating film is formed by a sputter method, a CVD (chemical vapor deposition) method, or the like such as to cover the silicon substrate 11. The gate insulating film may be comprised of a thermal oxidation film or the like such as a silicon oxide film, a silicon oxynitride film, or a silicon nitride film, and may be a SiON film having a thickness of 1.2 nm, for example. Further, a CVD method is applied to form a polysilicon film that covers the gate insulating film.

In the process step shown in FIG. 2B, photolithography and a RIE method are performed to perform selective etching of the polysilicon film and gate insulating film. This creates a multilayer gate structure comprised of a gate insulating film 13 and a gate electrode 14.

Figure 2C:
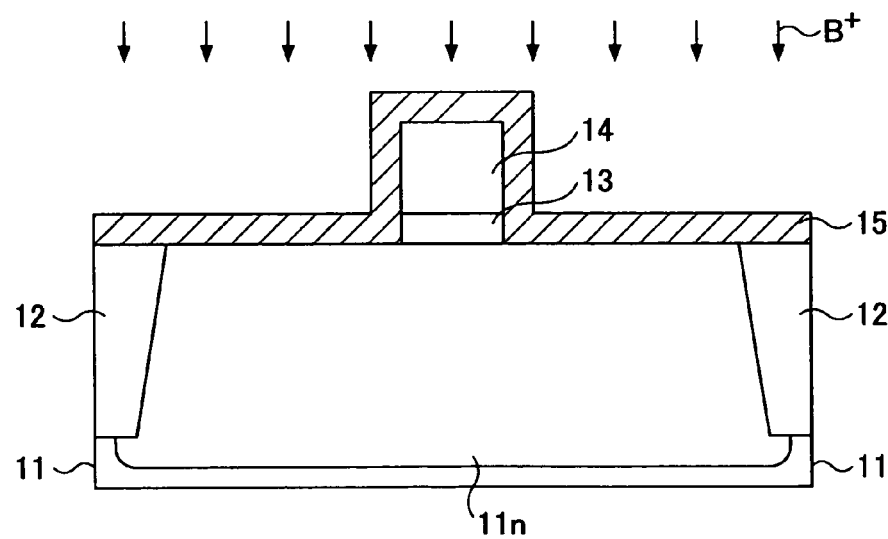

In the process step shown in FIG. 2C, an insulating film 15 comprised of a silicon oxide film, for example, is formed to a thickness of 20 nm, for example, by a CVD method on the surface of the silicon substrate 11 and on the gate electrode 14. Although a silicon oxide film may be preferable as the insulating film 15, a silicon oxynitride film or a silicon nitride film may suffice as well.

In the process step shown in FIG. 2C, further, a RIE method is applied to remove the insulating film 15 to expose the surface of the silicon substrate, thereby forming offset spacers 15A and 15B flanking the side walls of the gate electrode 14 as shown in FIG. 3A. The removal of the insulating film 15 by the RIE method is performed by use of a dry etching apparatus.

Figure 5:
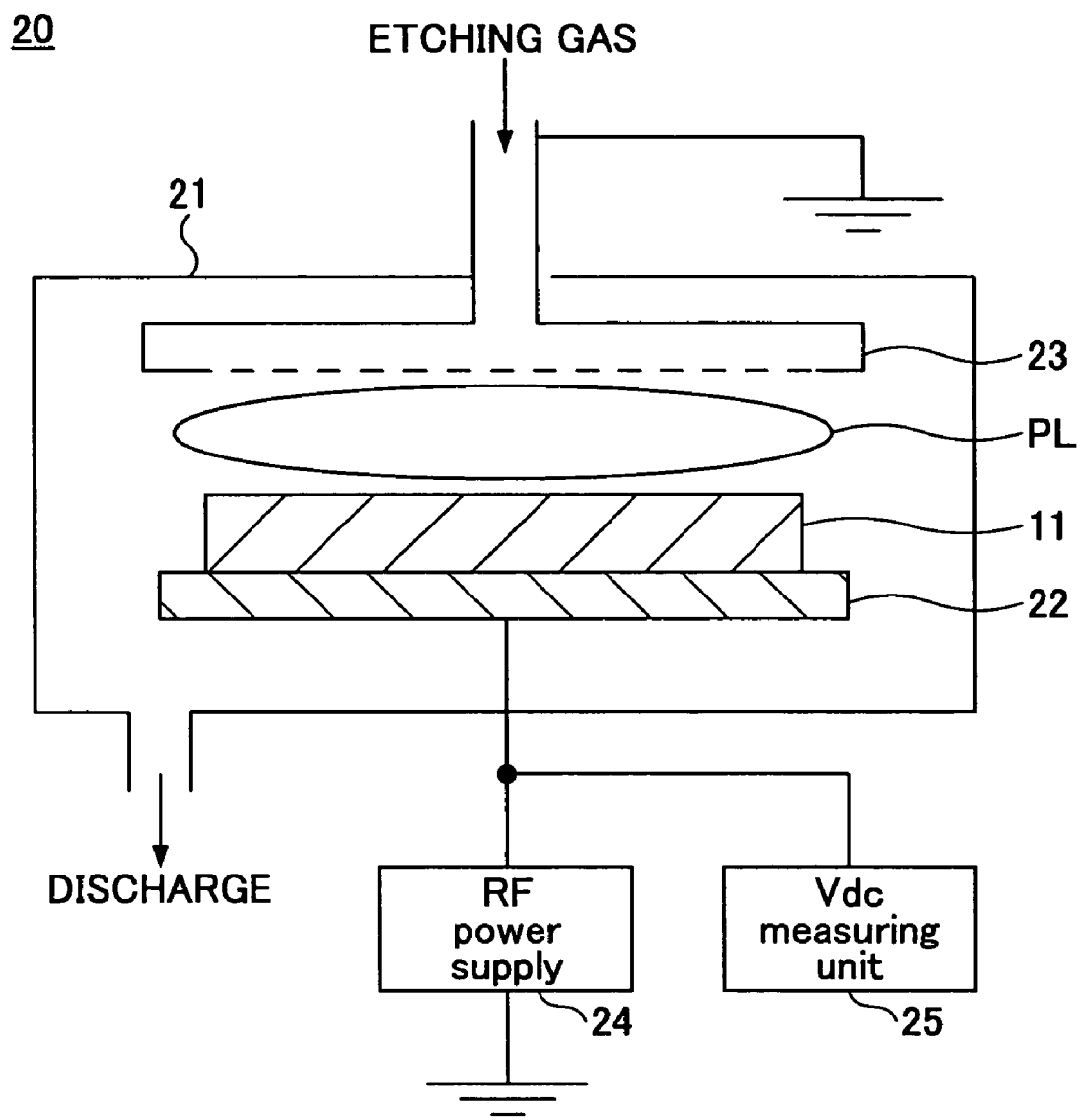
FIG. 5 is a drawing showing a schematic configuration of a dry etching apparatus.

FIG. 5 is a drawing showing a schematic configuration of a dry etching apparatus. Referring to FIG. 5, a dry etching apparatus 20 includes a vacuum chamber 21, a cathode electrode 22 supporting the silicon substrate 11 in the vacuum chamber 21, an anode electrode 23 so positioned as to oppose the cathode electrode 22, and a high-frequency (RF) power supply 24 coupled to the cathode electrode 22. The RF power supply 24 applies a high-frequency power between the cathode electrode 22 and the anode electrode 23 connected to the ground. A Vdc measuring unit 25 is coupled to the cathode electrode 22 for the purpose of measuring a self-bias voltage Vdc, which will later be described. Etching gas is guided into the vacuum chamber from a gas supply apparatus (not shown). A ventilation mechanism (not shown) is provided to take the gas out of the vacuum chamber.

For etching by the RIE method, etching gases such as a $CHF_3$ gas and an Ar gas are supplied into the vacuum chamber 21 in 50 sccm and 1000 sccm, respectively, with a RF power of 1 kW being applied to the cathode electrode 22. The etching gasses are ionized to generate plasma PL between the anode electrode 23 and the cathode electrode 22 inside the vacuum chamber 21. The etching gas ions have positive charge, so that they are pulled by the negative high-frequency voltage applied to the cathode electrode 22 so as to react with the insulating film 15 on the surface of the silicon substrate 11 shown in FIG. 2C, resulting in the insulating film 15 being evaporated.

As shown in FIG. 3A, after the removal of the insulating film 15, an affected layer 11DM is formed near the surface of the silicon substrate 11. The affected layer 11DM is created when the ionized etching gasses are impacted into the silicon substrate 11. Because of the shock of the impact and the injection of the etching gas ions into the silicon substrate 11, the crystalline quality of the silicon is degraded.

In the process shown in FIG. 3A, ellipsometry is used to measure the thickness LA of the affected layer 11DM. The ellipsometry makes it possible to measure the thickness of a thin film having a different refractive index than Si crystal. The affected layer 11DM has a refractive index of 2.1 when $CHF_3$ gas is used as an etching gas. In contrast, Si crystal, a natural oxidation film, and a thermal oxidation film have refractive indexes of 3.3, 1.8, and 1.5, respectively. In this manner, the affected layer 11DM has a refractive index different from those of the Si crystal and silicon oxide films, which allows its thickness LA to be measured. The position at which the measurement is taken can be anywhere as long as it is on the surface of the silicon substrate 11 from which the insulating film 15 is removed. It is preferable, however, that an area wider than the spot diameter of the incident light of ellipsometry is set aside in advance on the surface of the silicon substrate 11.

In the process shown in FIG. 3A, further, an injection parameter that achieves a predetermined sheet resistance for a source extension region 11EA and a drain extension region 11EB is derived based on the measured thickness LA of the affected layer by referring to the pre-acquired relationships between the injection parameter, the sheet resistance, and the thickness of the affected layer. The injection parameter that is controlled in response to the thickness of the affected layer 11DM is either an injection energy or the amount of dose.

Figure 6:
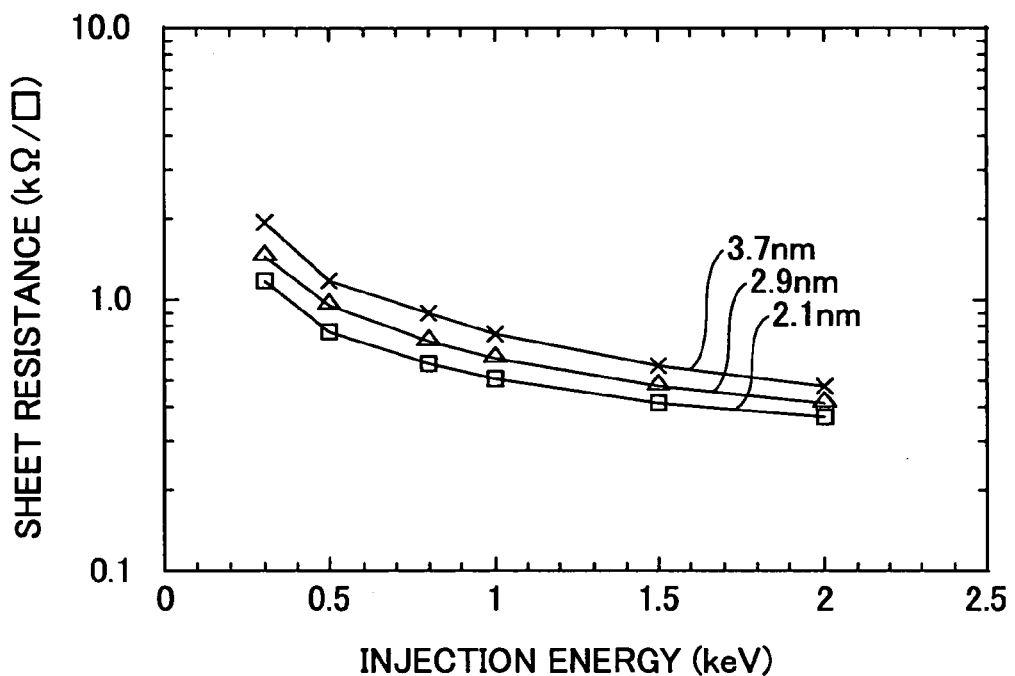
FIG. 6 is a drawing showing an example of the relationships between an injection energy, a sheet resistance, and the thickness of an affected layer.

FIG. 6 is a drawing showing an example of the relationships between the injection energy, the sheet resistance, and the thickness of the affected layer. In FIG. 6, the vertical axis represent the sheet resistance of the extension region, and the horizontal axis represents the injection energy. Curves plotted with "□", "Δ", and "X" correspond to an affected layer thickness of 2.1 nm, an affected layer thickness of 2.9 nm, and an affected layer thickness of 3.7 nm, respectively. These relationships are obtained from experiments in which silicon substrates with affected layers having three different thicknesses are used with different injection energies using $B^+$. In these experiments, the amount of dose was set to $1\times10^{15}/cm^2$, which was kept constant throughout all the injection conditions. The plotted sheet resistance corresponds to a value observed after the activating heat treatment, and was measured by use of the four-terminal method.

Referring to FIG. 6, the curves corresponding to the respective affected layer thicknesses show a trend that the sheet resistance drops as the injection energy increases. At the constant injection energy, as the affected layer thickness increases, the sheet resistance also increases.

From the relationships shown in FIG. 6, the injection energy that achieves a predetermined sheet resistance can be selected in response to the measured thickness of the affected layer. If the thickness of the affected layer is 2.9 nm, and if it is desired to set the sheet resistance to 0.6 kΩ/□, for example, the injection energy 1 keV that achieves a sheet resistance of 0.6 kΩ/□ at an affected layer thickness of 2.9 nm in FIG. 6 is selected.

FIG. 6 represents the relationships between the injection energy, the sheet resistance, and the affected layer thickness by way of a graph. Alternatively, the relationships between the injection energy, the sheet resistance, and the affected layer thickness may be represented as a correlation formula, and an injection energy may be calculated based on this correlation formula. Alternatively, the injection energy, the sheet resistance, and the affected layer thickness may each be divided into ranges, and the relationships between the injection energy, the sheet resistance, and the affected layer thickness may be represented by a correspondence table showing correspondences between the ranges. Based on this correspondence table, an injection energy may be derived.

Figure 7:
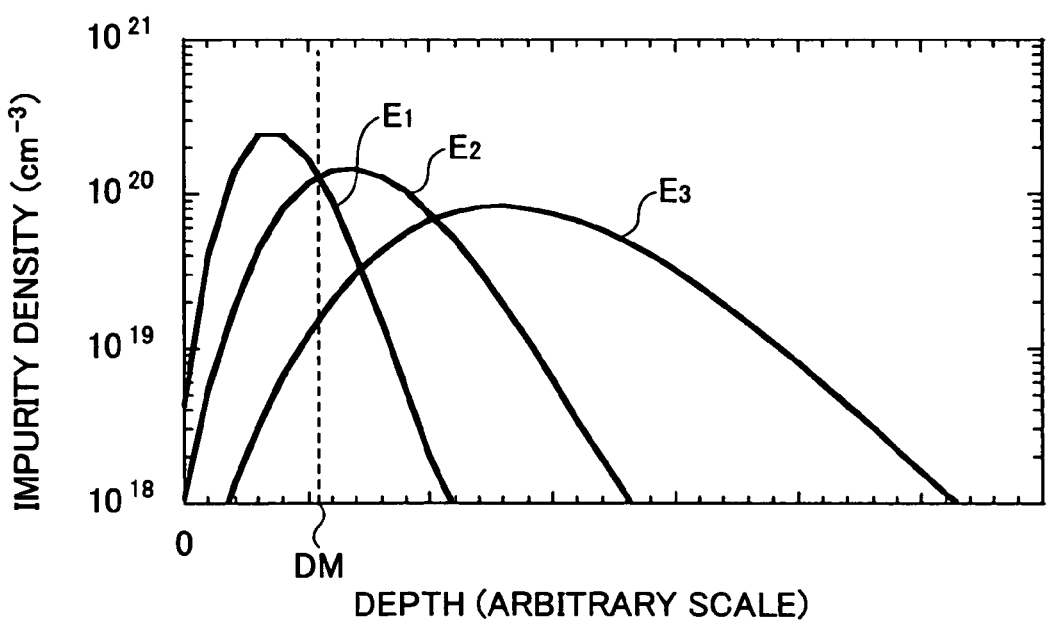
FIG. 7 is a drawing for explaining the relationships between an injection parameter, the sheet resistance, and the affected layer thickness.

FIG. 7 is a drawing for explaining the relationships between the injection parameter, the sheet resistance, and the affected layer thickness. In FIG. 7, the vertical axis represents the density of an impurity element, and the horizontal axis represents a depth from the surface of the silicon substrate. In FIG. 7, the thickness of the affected layer is assumed to be DM. FIG. 7 demonstrates the density distribution of impurity that is formed when B+ serving as a p-type impurity element is injected with different injection energies E1 through E3 (E1<E2<E3). What is shown in FIG. 7 was obtained by simulation. The amount of dose was kept constant throughout the calculation of different injection energies E1 through E3.

Referring to FIG. 7, the impurity element B+ injected with the injection energy E1 is distributed in the affected layer and in the silicon substrate at depth deeper than the depth DM of the affected layer. The impurity element B+ diffused in the affected layer has a low activation rate even after the activating heat treatment due to the degradation of the crystalline quality of the Si crystal in the affected layer, and, thus, does not contribute to hole-based conduction. The impurity element that is distributed in the silicon substrate at depth deeper than the affected layer, on the other hand, contributes to hole-based conduction. The amount of such impurity element is represented by the size of the area defined by the impurity density curve and the vertical line at the affected layer depth DM on the deeper side. It is believed that the amount of the impurity element and the sheet resistance are substantially reciprocal to each other in this area.

When the injection energy is increased from E1 to E2, or to E3, the peak of the impurity element density curve drops, and the impurity element B+ reaches further depth. As a result, the amount of the impurity element existing at depth deeper than the affected layer thickness DM increases, causing the sheet resistance to decrease. In the manner as described above, the injection parameter, the sheet resistance, and the thickness of the affected layer are related to each other.

In FIG. 6, the thickness of the affected layer was measured by ellipsometry as previously described. In FIG. 6, the thickness of the affected layer may alternatively be measured by use of another method instead of the ellipsometry method. For example, the SIMS (Secondary Ion Mass Spectrometry) may be used. The SIMS can measure the thickness of an affected layer by analyzing the change, in the thickness direction of the silicon substrate, of the element composition of the etching gasses used for dry etching.

Figure 8A:
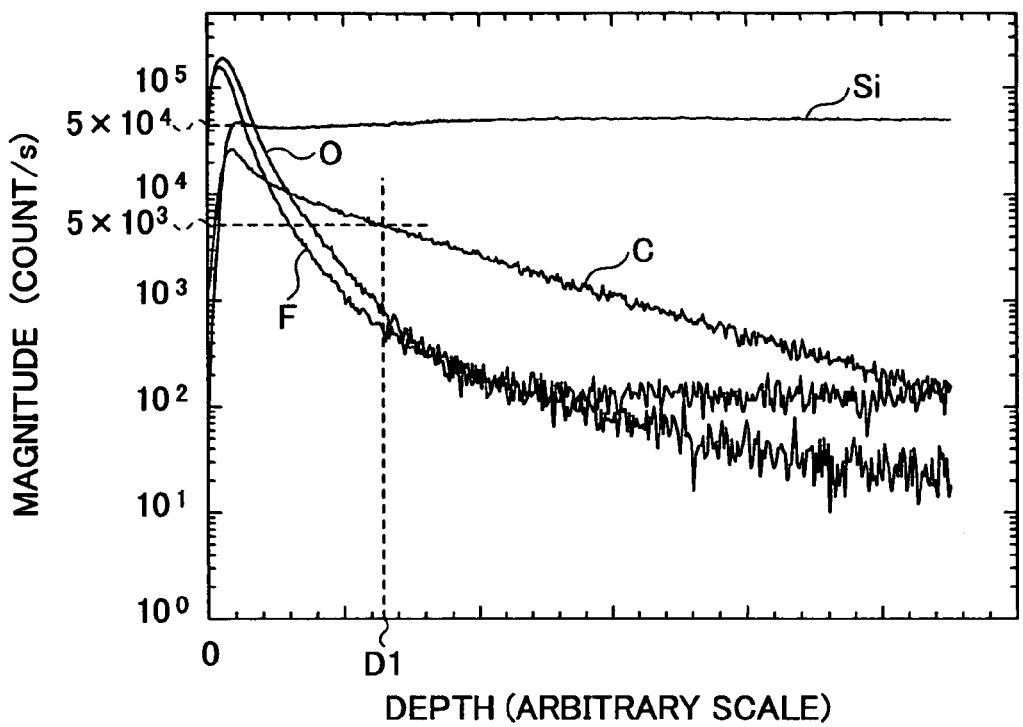
FIGS. 8A and 8B are drawings showing the depth-direction profiles of a silicon substrate as measured by the SIMS method.
Figure 8B:
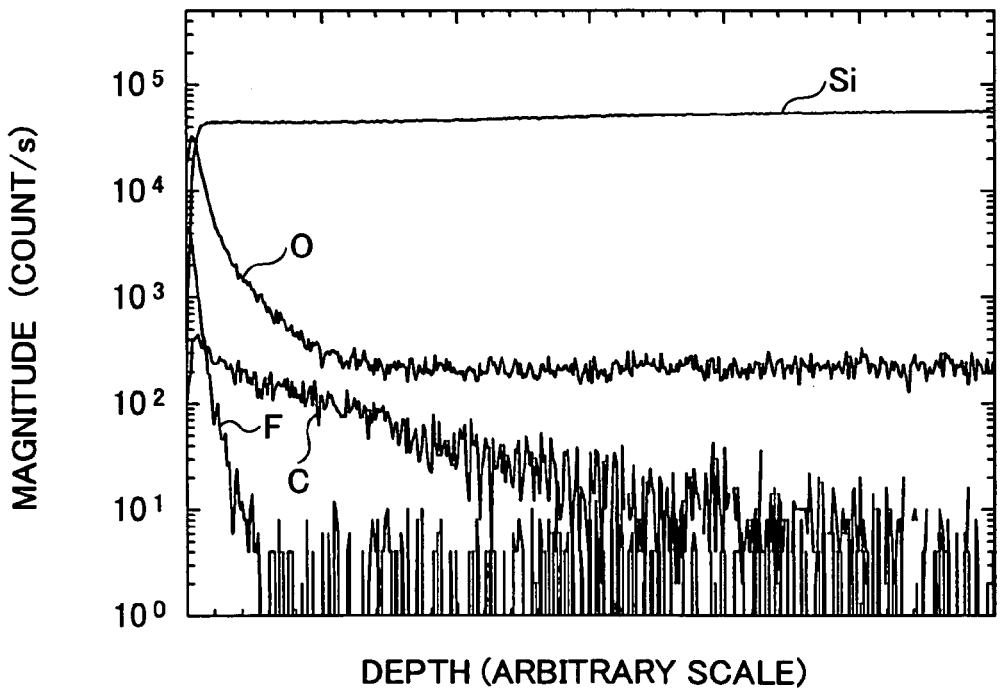

FIGS. 8A and 8B are drawings showing the depth-direction profiles of a silicon substrate as measured by the SIMS method. FIG. 8A corresponds to a case in which dry etching is performed by use of the RIE method shown in the process of FIG. 2C. FIG. 8B corresponds to a case in which such dry etching is not performed. In FIGS. 8A and 8B, the vertical axis represents the magnitude of elements (the number of counts per second), and the horizontal axis represents a depth from the surface of the silicon substrate. The depth is shown in arbitrary units. In the graphs, profiles shown with "Si", "O", "C", and "F" correspond to respective elements that are analyzed. In the dry etching of FIG. 8A, a $CHF_3$ gas and an Ar gas were used as etching gasses.

Referring to FIGS. 8A and 8B, the magnitude of O, C, and F relative to the Si magnitude is higher close to the surface of the silicon substrate in the case of the presence of dry etching shown in FIG. 8A than in case of the absence of dry etching shown in FIG. 8B. The thickness of the affected layer may be set to the depth that achieves the C magnitude that is 1/10 of the Si magnitude, for example. In FIG. 8A, a depth D1 achieves the C magnitude that is 1/10 of the Si magnitude equal to $5\times10^4$ (counts/second). The profile of C has more genteel changes in the depth direction than the profile of F or O, which allows the thickness of the affected layer to be determined with higher accuracy. Although it is preferable to use the C magnitude, the F magnitude or O magnitude may alternatively be used. The magnitude of another element may as well be used depending on what etching gas is used.

When the thickness of the affected layer in the relationships shown in FIG. 6 is measured by use of a method such as the SIMS method other than the ellipsometry method, a correlation between the thickness measured by such method and the thickness of the affected layer measured by the ellipsometry method is obtained in advance. By use of this correlation and the relationships shown in FIG. 6, an injection parameter is derived based on the measured thickness of the affected layer in the process shown in FIG. 3A.

In the process shown in FIG. 3B, the injection parameter derived in the process of FIG. 3A is used, and a p-type impurity such as B+ is injected by use of the ion injection method into the silicon substrate 11 in the device region 11A, with the gate electrode 14 and the offset spacers 15A and 15B serving as a mask. This forms the source and drain extension regions 11EA and 11EB. The use of the injection energy responsive to the thickness of the affected layer allows variation between the silicon substrates 11 to be suppressed with respect to the sheet resistance of the source and drain extension regions 11EA and 11EB.

In the process shown in FIG. 3A, the amount of dose may alternatively be selected as an injection parameter. In this case, relationships similar to those shown in FIG. 6 are obtained by using the horizontal axis to represent the amount of dose. Namely, when the amount of dose is increased with the injection energy E1 in FIG. 7, the impurity density curve is shifted toward higher impurity density without a change in the shape of the curve. As a result, the amount of the impurity element that is present in the silicon substrate at depth deeper than the affected layer depth DM increases, causing the sheet resistance to decrease. Further, the impurity element may be limited to a shallow area by setting the injection energy low, which is advantageous for high-speed operation of the transistor.

In the process shown in FIG. 3C, a CVD method is used to form an insulating film such as a silicon nitride film, for example, covering the surface of the structure shown in FIG. 3B, followed by performing an etchback so as to form side-wall insulating films 16A and 16B flanking the side walls of the offset spacers 15A and 15B. Further, with the gate electrode 14, the offset spacers 15A and 15B, and the side-wall insulating films 16A and 16B serving as a mask, a p-type impurity such as B+ is introduced by use of the ion injection method into the silicon substrate 11 in the areas outside the side-wall insulating films 16A and 16B, thereby forming source and drain regions 11S and 11D.

Figure 4:
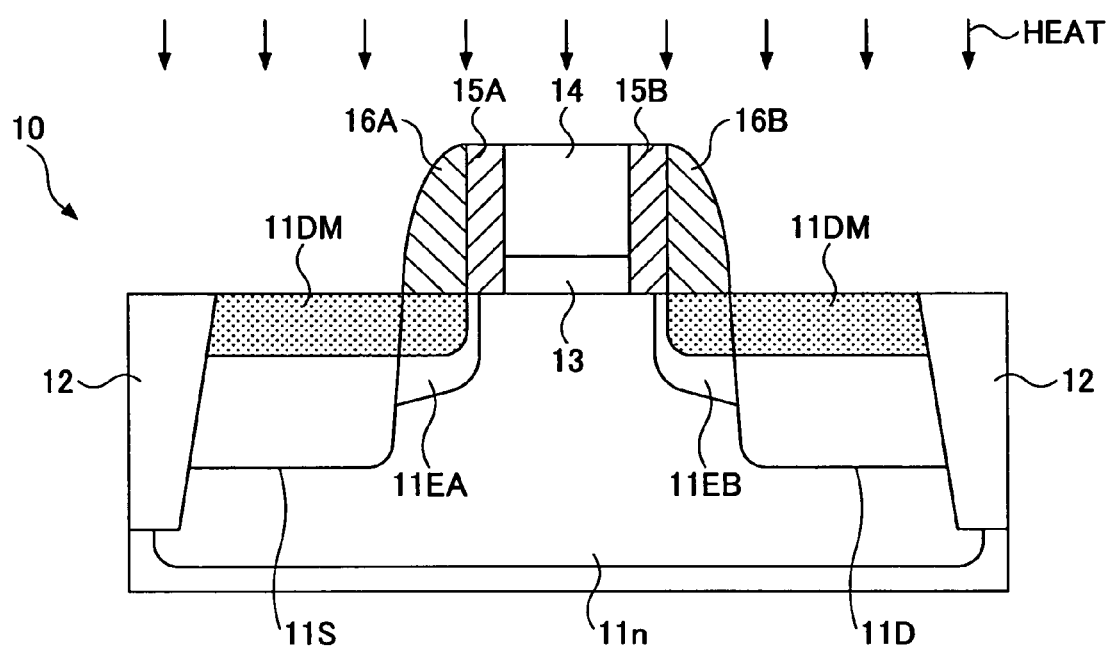
FIG. 4 is a drawing showing a step of manufacturing a semiconductor device according to the first embodiment of the present invention.

Thereafter, in the process shown in FIG. 4, a furnace or RTP (Rapid Thermal Processor) is used to heat the structure shown in FIG. 3C, thereby performing an activating heat treatment with respect to the impurity element injected into the silicon substrate 11. The activating heat treatment may be performed as two separate heat treatments, one for activating the impurity element of the source and drain extension regions 11EA and 11EB and the other for activating the impurity element in the source and drain regions 11S and 11D. In the manner as described above, a p-channel MOS transistor 10 is formed.

In the manufacturing steps described above, a step of deriving an activating heat treatment parameter (S109 shown in FIG. 1) may be provided in place of the step of deriving the parameter for injecting an impurity element (S108 shown in FIG. 1) The activating heat treatment parameter derived in the step of deriving an activating heat treatment parameter may be used to control the thermal diffusion of an impurity element, thereby performing the activating heat treatment that achieves a predetermined sheet resistance for the source and drain extension regions 11EA and 11EB. The activating heat treatment parameter controlled in this case may be an activation temperature or an activating heat treatment time. In such a case, injection is performed in the injection process of FIG. 3B with a predetermined injection energy (e.g., the injection energy that achieves a predetermined sheet resistance for the source and drain extension regions 11EA and 11EB when the thickness of the affected layer is assumed to be substantially 0 nm). Based on the relationships between the activation temperature (or the activating heat treatment time), the sheet resistance, and the thickness of the affected layer, the activation temperature (or activating heat treatment time) is derived. The activation temperature or activating heat treatment time is controlled in this manner, thereby setting the source and drain extension regions 11EA and 11EB shown in FIG. 4 to a predetermined sheet resistance.

According to the manufacturing method of this embodiment, the thickness of the affected layer is measured separately for each silicon substrate 11, and an injection parameter or activating heat treatment parameter is set in response to the measured thickness of the affected layer by referring to the pre-acquired relationships between the injection parameter or activating heat treatment parameter, the sheet resistance, and the thickness of the affected layer. This allows variation between silicon substrates to be suppressed with respect to the sheet resistance of the source and drain extension regions 11EA and 11EB. With this provision, it is possible to suppress the variation of electrical characteristics such as the on-resistance of the p-channel MOS transistor 10 between the silicon substrates 11. It should be noted that this embodiment achieves the same advantage in the case of an n-channel MOS transistor.

An affected layer is mainly formed in the offset-spacer forming step, but is also formed earlier in the step of forming a gate insulating film and gate electrode shown in FIG. 2B. To be specific, in the step of forming a gate insulating film and gate electrode, an affected layer is formed when the gate insulating film and gate electrode are subjected to dry etching for selective removal or when a resist film used as a mask is removed by plasma ashing. In the manufacturing method according to the present embodiment, the thickness of the affected layer is measured immediately before the extension forming step even when the affected layer is formed through a plurality of steps. This allows the injection parameter or activating heat treatment parameter to be properly set. Consequently, the variation of the sheet resistance of source and drain extension regions between silicon substrates can further be suppressed.

In the manufacturing method of the present embodiment, a semiconductor device having offset spacers has been described as an example. The present invention is equally applicable to a semiconductor device in which the formation of offset spacers is omitted. In such a case, an affected layer is mainly formed in the step of forming a gate insulating film or gate electrode as described above. The injection parameter or activating heat treatment parameter is set in response to the thickness of such affected layer. This manufacturing method is substantially the same as the manufacturing method previously described, except for the omission of the process shown in FIG. 2C.

When the semiconductor device is a CMOS (complementary MOS) transistor, it is preferable to measure the thickness of an affected layer with respect to both the device area of the p-channel MOS transistor and the device area of the n-channel MOS transistor. In the step of forming source and drain extension regions of the CMOS transistor, for example, a p-type impurity element may be first injected into the device area in which the p-channel MOS transistor is to be formed. In such a case, a resist film is provided to cover the device area of the n-channel MOS transistor in order to avoid the injection of the p-type impurity element. After the p-type impurity element is implanted into the device area of the p-channel MOS transistor, the resist film is removed by plasma ashing from the surface of the device area of the n-channel MOS transistor. When this is done, the surface of the silicon substrate in the device area of the n-channel MOS transistor may be affected by the impact of Ar(Oxygen) ions or the like in ashing plasma, ending up having an increased thickness of the affected layer. In such a case, the thickness of the affected layer is preferably measured at this point in time. This allows the thickness of the affected layer to be measured with higher accuracy, thereby suppressing the variation of the sheet resistance of extension regions. If the source and drain extension regions are formed first in the device area of the n-channel MOS transistor, the thickness of the affected layer in the device area of the p-channel MOS transistor is measured after the removal of the resist film covering this device area.

Second Embodiment

In the method of manufacturing a semiconductor device according to a second embodiment of the present invention, the thickness of an affected layer is estimated, rather than measured, based on the conditions of the dry etching process performed in the step of forming offset spacers. Based on the estimated thickness of the affected layer, the injection parameter or activating heat treatment parameter is determined.

Referring to FIG. 1 again, the method of manufacturing a semiconductor device according to the second embodiment includes a step (S102) of forming a gate insulating film and a gate electrode on the surface of a silicon substrate corresponding to a device area, an offset spacer forming step (S104), a step (S107) of estimating the thickness of an affected layer formed in the surface of the silicon substrate, a step (S108) of deriving a parameter for injecting an impurity element, an extension region forming step (S110) of injecting an impurity element into the silicon substrate, a side-wall insulating film forming step (s112), a step (S114) of forming a source region and drain region, and an activating heat treatment step (S116). This manufacturing method is substantially the same as the method of manufacturing a semiconductor device according to the first embodiment, except for the affected layer thickness estimating step (S107), and a description of the same steps will be omitted.

In the affected layer thickness estimating step (S107), the self-bias voltage Vdc, which is applied at the time of dry etching performed in the offset spacer forming step shown in FIG. 2C, is monitored separately for each silicon substrate. The thickness of the affected layer is estimated based on the self-bias voltage Vdc. Based on the estimated thickness of the affected layer, the injection parameter or activating heat treatment parameter is determined in the same manner as in the first embodiment.

Figure 9:
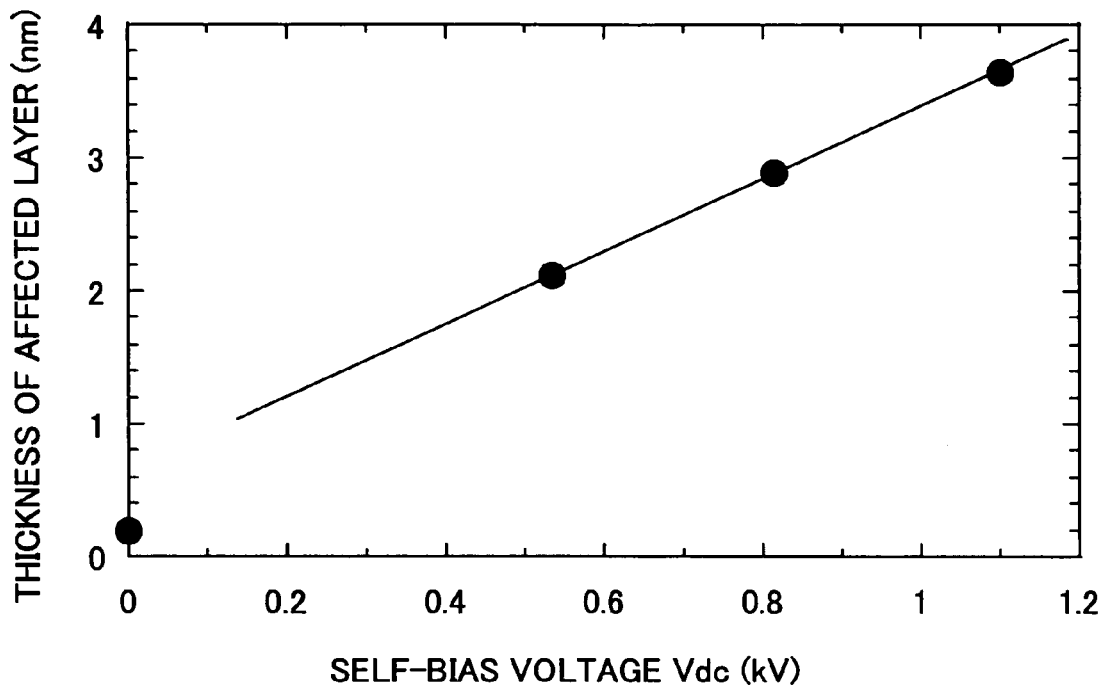
FIG. 9 is a drawing showing the relationships between the affected layer thickness and a self-bias voltage Vdc.

FIG. 9 is a drawing showing the relationships between the affected layer thickness and the self-bias voltage Vdc. In FIG. 9, the horizontal axis represents the absolute value of the self-bias voltage Vdc. In FIG. 9, the thickness of the affected layer corresponding to 0 kV of the self-bias voltage Vdc is the thickness of a natural oxidation film.

Referring to FIG. 9, analysis conducted by the inventors of the present invention reveals that the self-bias voltage Vdc and the affected layer thickness are substantially proportional to each other under the etching conditions that are normally used. Namely, the larger the absolute value of the self-bias voltage Vdc, the greater the thickness of the affected layer is.

The self-bias voltage Vdc is dependent on the RF power, a pressure ratio of the etching gasses in the vacuum chamber, the types of impurity gasses generated due to contamination inside the vacuum chamber, a pressure ratio of these impurity gasses, etc. Accordingly, even if the RF power and the etching conditions such as the amount of flow of etching gasses are set to the same values throughout a plurality of dry etching apparatuses of the same model having the same configuration, the self-bias voltage Vdc may often be different from apparatus to apparatus. Further, the self-bias voltage Vdc tends to change depending on the operation time of the dry etching apparatus such as the operation time after cleaning the vacuum chamber. In this manner, the self-bias voltage Vdc changes from apparatus to apparatus, and also changes with the passage of time. Because of this, the thickness of the affected layer 11DM varies, depending on which dry etching apparatus is used for etching and on the timing at which the dry etching is performed.

In this embodiment, as shown in FIG. 5, the Vdc measuring unit 25 is provided for the cathode electrode of the dry etching apparatus, and monitors the self-bias voltage Vdc separately for each silicon substrate 11. Based on the self-bias voltage Vdc, the thickness of the affected layer is estimated for each silicon substrate 11 based on the relationships shown in FIG. 9. This eliminates the need for the measurement of the thickness of an affected layer, and eliminates the need for the management of an ellipsometer. Also, the manufacturing facility can be simplified.

Based on the estimated thickness of the affected layer, an injection parameter that achieves a predetermined sheet resistance for the source and drain extension regions 11EA and 11EB is derived by referring to the pre-acquired relationships between the injection parameter, the sheet resistance, and the thickness of the affected layer, as in the process shown in FIG. 3A of the first embodiment. Thereafter, the step of FIG. 3C and the subsequent steps are performed in the same manner. In this manner, the p-channel MOS transistor 10 is formed.

It should be noted that in the offset spacer forming step shown in FIG. 2C, the insulating film 15 needs to be removed cleanly over the entire surface of the silicon substrate 11 (wafer) at the time of removal of the insulating film 15 by the RIE method, resulting in the need that an over etching process be performed to extend the dry etching for a predetermined time period after an end point of the removal of the insulating film is detected. This over etching process results in the surface of the silicon substrate 11 being impacted by ions, which causes the thickness of the affected layer 11DM to increase. In such a case, the time length of the over etching is monitored to estimate the thickness of the affected layer. The end point of the removal of the insulating film is detected by detecting a change in the spectrum of light emitted by the plasma PL shown in FIG. 5 or by detecting a change in the voltage (e.g., the Electron Static Chack voltage to set wafer on the cathode electrode 22) applied to the cathode electrode 22 from the negative DC power supply connected to the RF power supply 24.

Figure 10:
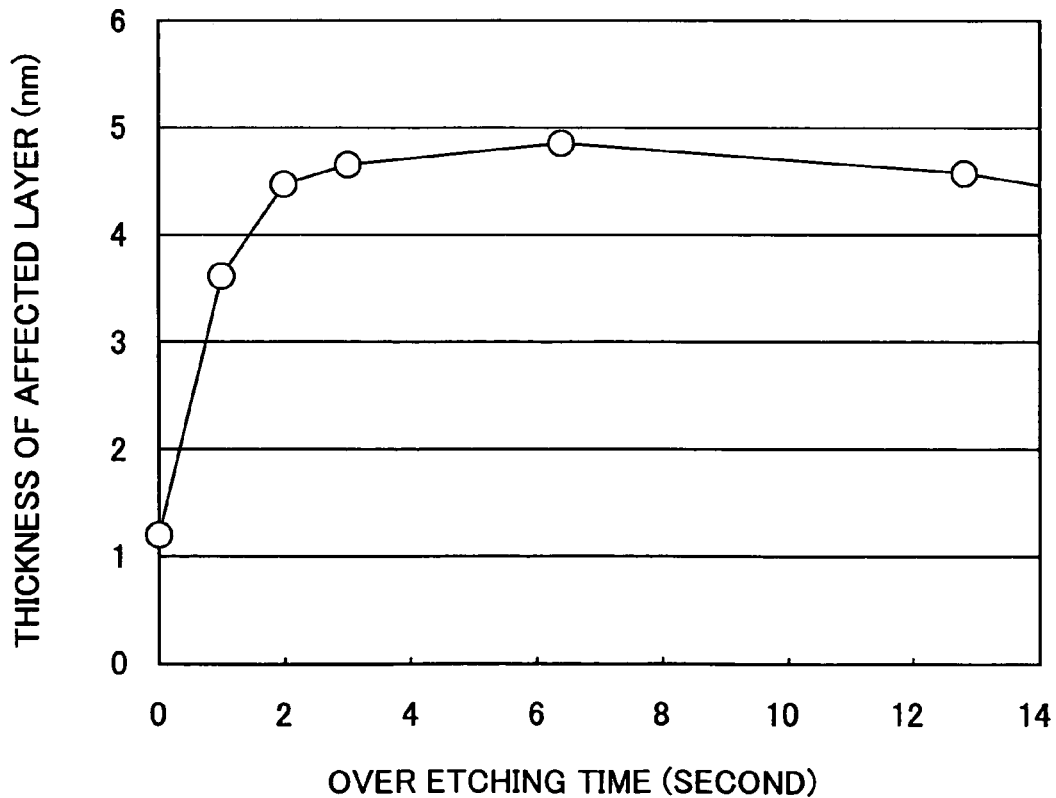
FIG. 10 is a drawing showing an example of the relationships between the thickness of an affected layer and the time length of an over etching process.

FIG. 10 is a drawing showing an example of the relationships between the thickness of an affected layer and the time length of an over etching process. The over etching time is the time length of an extended dry etching after the end point of the removal of an insulating film is detected.

Referring to FIG. 10, as the over etching time increases, the thickness of the affected layer increases. Further, the thickness of the affected layer becomes substantially constant after the over etching time reaches a certain point. The over etching time is set to an etching time multiplied by a predetermined factor where the etching time is defined as a time length from the start of a dry etching to the detection of the end of the dry etching. Since the etching time may often differ from silicon substrate to silicon substrate (from wafer to wafer), the over etching time also often differ from silicon substrate to silicon substrate. In consideration of this, the over etching time is monitored, and the thickness of the affected layer in the silicon substrate can be estimated based on the obtained over etching time by referring to the relationship shown in FIG. 10. The thickness of an affected layer in the case of presence of an over etching is estimated based on the self-bias voltage Vdc and the over etching time. It should be noted that the relationship shown in FIG. 10 is only an example, and may be obtained separately for each dry etching condition.

According to the manufacturing method of this embodiment, the self-bias voltage Vdc used for dry etching in the offset spacer forming step is monitored for each silicon substrate, and the thickness of the affected layer is estimated based on the estimated self-bias voltage Vdc. Then, an injection parameter or activating heat treatment parameter is set for each silicon substrate in response to the estimated thickness of the affected layer by referring to the pre-acquired relationships between the injection parameter or activating heat treatment parameter, the sheet resistance, and the thickness of the affected layer. This allows variation between silicon substrates to be suppressed with respect to the sheet resistance of the source and drain extension regions.

In this manufacturing method, further, there is no need to measure the thickness of an affected layer for each silicon substrate, which serves to simplify the manufacturing facility. Further, since the thickness of an affected layer is estimated by monitoring the self-bias voltage Vdc and optionally the over etching time, it is easier to obtain the thickness of the affected layer than in the case in which the thickness of the affected layer is measured.

Third Embodiment

A system for manufacturing a semiconductor device according to a third embodiment of the present invention is a system that is suited to perform the manufacturing method according to the first and second embodiments as described above.

Figure 11:
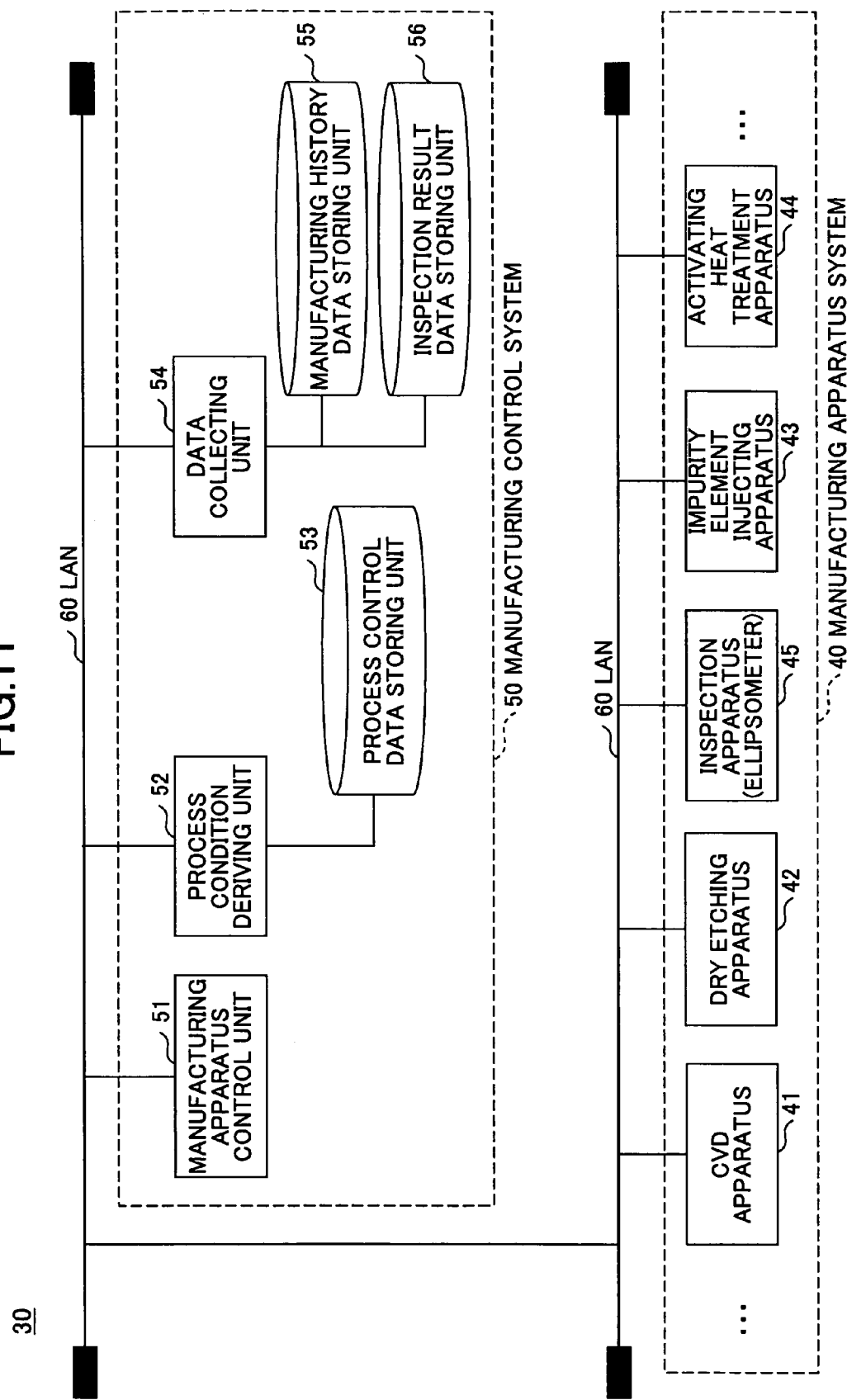
FIG. 11 is a block diagram showing the configuration of a semiconductor device manufacturing system according to a third embodiment of the present invention.

FIG. 11 is a block diagram showing the configuration of a semiconductor device manufacturing system according to the third embodiment of the present invention.

Referring to FIG. 11, a semiconductor device manufacturing system 30 includes a manufacturing apparatus system 40, a manufacturing control system 50 for controlling the manufacturing apparatus system 40, and a local area network (LAN) 60 connecting the manufacturing apparatus system 40 and the manufacturing control system 50 together.

The manufacturing apparatus system 40 includes a CVD apparatus 41, a dry etching apparatus 42, an impurity element injecting apparatus 43, an activating heat treatment apparatus 44, and an inspection apparatus 45 such as ellipsometer. Each of the apparatuses 41 through 45 of the manufacturing apparatus system 40 is connected to the LAN 60. Each of the apparatuses 41 through 45 of the manufacturing apparatus system 40 is provided with a camera (not shown) that scans wafer identification information as a wafer is supplied. Further, each of the apparatuses 41 through 45 is provided with an apparatus controller (not shown). This apparatus controller receives from a manufacturing apparatus control unit 51 of the manufacturing control system 50 a process recipe that defines the process conditions and inspection conditions for the wafer, and controls the processing of the wafer according to the process recipe. Further, the apparatus controller automatically transmits process data and inspection data regarding the wafer to a data collecting unit. A wafer conveyor mechanism provided between the manufacturing apparatuses 41 through 45 is omitted from the illustration.

The manufacturing control system 50 includes the manufacturing apparatus control unit 51 for creating the process recipe for each of the manufacturing apparatuses 41 through 45 and transmitting the created process recipe to each of the manufacturing apparatuses 41 through 45, a data collecting unit 54 for collecting the wafer identification information and wafer process data transmitted from each of the manufacturing apparatuses 41 through 45 separately for each wafer and for collecting inspection result data received from the inspection apparatus, and a process condition deriving unit 52 for deriving a process parameter based on the process data, inspection result data, and process control data.

The data collecting unit 54 includes a manufacturing history data storing unit 55. The manufacturing history data storing unit 55 stores the wafer identification information and wafer process data separately for each wafer. The process data relates to the process conditions of each of the apparatuses 41 through 45, and also relates to the process temperature, the amount of gas flow, the degree of vacuum, etc., which are actually monitored at the time of each process. In the case of the manufacturing method of the second embodiment, for example, this process data corresponds to the condition of dry etching performed by the dry etching apparatus, a monitored self-bias voltage Vdc, an over etching time, etc.

The data collecting unit 54 includes an inspection result data storing unit 56. The inspection result data storing unit 56 stores the wafer identification information and wafer inspection data separately for each wafer. In the case of the first embodiment described above, for example, the inspection data corresponds to the thickness of an affected layer measured by the ellipsometer.

The process condition deriving unit 52 includes a process control data storing unit 53. The process control data storing unit 53 stores data for deriving a process parameter. For example, the process control data storing unit 53 stores the relationships between the affected layer thickness and the injection energy as shown in FIG. 6, the relationships between the affected layer thickness and the self-bias voltage as shown in FIG. 9, etc.

The process condition deriving unit 52 receives data indicative of an affected layer thickness from the process control data storing unit 53 of the data collecting unit 54 separately for each wafer, for example. The process condition deriving unit 52 further receives the relationships between the affected layer thickness and the injection energy from the process control data storing unit 53, thereby deriving the injection energy that achieves a desired sheet resistance for the extension regions. The process condition deriving unit 52 transmits the derived value to the manufacturing apparatus control unit 51. The manufacturing apparatus control unit 51 then transmits a process recipe inclusive of the process parameter and other etching conditions to the dry etching apparatus 42.

The semiconductor device manufacturing system 30 is particularly suitable for the manufacturing method of the second embodiment. In the following, with reference to FIG. 1 and FIG. 11, a description will be given of a case in which the semiconductor device manufacturing system 30 performs the manufacturing method of the second embodiment.

The CVD apparatus 41 and the dry etching apparatus 42 are used to perform the step (S102) of forming a gate insulating film and gate electrode on the surface of a silicon substrate corresponding to the device area. Thereafter, the CVD apparatus 41 is used to form an insulating film, and, the dry etching apparatus 42 selectively removes the insulating film to perform the offset spacer forming step (S104). In so doing, the self-bias voltage Vdc is monitored, and is transmitted with the wafer identification information to the data collecting unit 54. The transmitted data is stored in the manufacturing history data storing unit 55. The process condition deriving unit 52 then receives the self-bias voltage Vdc of the relevant wafer from the manufacturing history data storing unit 55, and receives a data set indicative of the relationships between the affected layer thickness and the self-bias voltage from the process control data storing unit 53. The process condition deriving unit 52 estimates the thickness of the affected layer in response to the self-bias voltage Vdc by referring to the data set.

The process condition deriving unit 52 further derives an injection parameter (S108) in response to the estimated thickness of the affected layer by referring to the relationships between the affected layer thickness and the injection energy as received from the process control data storing unit 53. The injection parameter, together with other injection conditions, are transmitted from the manufacturing apparatus control unit 51 to the impurity element injecting apparatus.

The impurity element injecting apparatus 43 performs an extension region forming step (S110) based on the injection parameter. Further, the CVD apparatus 41, the dry etching apparatus 42, the impurity element injecting apparatus 43, and the activating heat treatment apparatus 44 are used to perform the steps from the side-wall insulating film forming step (s112) through the activating heat treatment step (S116).

As described above, the semiconductor device manufacturing system 30 stores data separately for each wafer in the data collecting unit 54, such data including process data or inspection result data obtained from the manufacturing apparatuses 40 through 44 or from the inspection apparatus 45 provided upstream in the manufacturing processes. Based on the stored data, the process condition deriving unit 52 derives a process parameter to be used downstream in the manufacturing processes by referring to the process control data. The manufacturing apparatus control unit 51 then transmits the process recipe inclusive of the derived process parameter to the manufacturing apparatuses 40 through 45. Each of the manufacturing apparatuses 40 through 44 performs its process based on the process parameter derived separately for each wafer, thereby performing a process suitable for the wafer affected by the condition and state of the upstream manufacturing apparatuses. In particular, a semiconductor device in which the variation of the sheet resistance of extension regions as exist from wafer to wafer is suppressed. Further, even when the semiconductor device manufacturing system 30 employs a plurality of dry etching apparatuses, the variation of the sheet resistance of extension regions as is caused by the variation of the thickness of the affected layer due to the differences between the dry etching apparatuses can be suppressed.

Further, the present invention is not limited to these embodiments, but various variations and modifications may be made without departing from the scope of the present invention.

The first through third embodiments have been described with reference to an example in which a MOS transistor is formed in the silicon substrate. The present invention is not limited to the use of a silicon substrate, and is equally applicable to other semiconductor substrates such as an SiGe substrate, an SOI (silicon-on-insulator) substrate, and the like.

What is claimed is:

1. A method of manufacturing a semiconductor device, which has a gate electrode and a pair of diffusion layers formed in a semiconductor substrate on sides of the gate electrode, comprising:
    forming an insulating film and a gate electrode on a semiconductor substrate of a given wafer including a step of forming an insulating layer over the semiconductor substrate and subsequently removing the insulating layer by impacting ionized etching gases on the insulating layer and semiconductor substrate;
    obtaining, separately for each wafer, a thickness value of an affected layer formed in a surface of the semiconductor substrate, the affected layer having been created when the ionized etching gasses for removing the insulating layer were impacted into the semiconductor substrate;
    forming a pair of diffusion layers by injecting an impurity element into the semiconductor substrate in areas flanking the gate electrodes based on a controlled injection parameter;
    performing heat activation for the injected impurity element based on a controlled heat activation parameter; and
    a parameter deriving step provided between said obtaining a thickness value of an affected layer and said forming a pair of diffusion layers, said parameter deriving step deriving the controlled injection parameter separately for each wafer in response to the obtained thickness value of the affected layer.

2. The method as claimed in claim 1, wherein said parameter deriving step derives the injection parameter or heat treatment parameter in response to the obtained thickness value of the affected layer by referring to pre-acquired relationships between the injection parameter or heat treatment parameter, the sheet resistance of the diffusion layers, and the thickness value of the affected layer.

3. The method as claimed in claim 2, wherein the thickness value of the affected layer as defined in said relationships is obtained by use of ellipsometry.

4. The method as claimed in claim 2, wherein the thickness value of the affected layer as defined in said relationships is obtained based on a depth profile of an element in the semiconductor substrate as obtained by use of an SIMS method, said element contained in a gas used in a dry etching process.

5. The method as claimed in claim 2, wherein the injection parameter is at least one of an injection energy and an amount of injected dose.

6. The method as claimed in claim 2, wherein the heat treatment parameter is either a heat treatment temperature or a heat treatment time.

7. The method as claimed in claim 1, wherein said obtaining a thickness value of an affected layer measures the thickness value of the affected layer by use of ellipsometry.

8. The method as claimed in claim 1, wherein said obtaining a thickness value of an affected layer includes:
    monitoring an etching parameter used in a dry etching process performed prior to said forming a pair of diffusion layers; and
    estimating the thickness value of the affected layer formed in the surface of the semiconductor substrate in response to the monitored etching parameter by referring to a pre-acquired relationship between the etching parameter and the thickness value of the affected layer.

9. The method as claimed in claim 1, further comprising forming a pair of offset spacer films flanking side walls of the gate electrode, prior to said forming a pair of diffusion layers, by forming an insulating film covering the surface of the semiconductor substrate and the gate electrode and by removing the insulating film through a dry etching process, wherein said obtaining a thickness value of an affected layer estimates the thickness value of the affected layer formed in the surface of the semiconductor substrate in response to an etching parameter of said dry etching process by referring to a pre-acquired relationship between the etching parameter and the thickness value of the affected layer.

10. The method as claimed in claim 9, wherein the etching parameter includes a self-bias voltage that is monitored during said dry etching process.

11. The method as claimed in claim 10, wherein the etching parameter further includes an over etching time that is monitored during said dry etching process.

* * * * *